(12) United States Patent
Kishimoto et al.

(10) Patent No.: US 10,862,020 B2
(45) Date of Patent: Dec. 8, 2020

(54) ELASTIC WAVE DEVICE

(71) Applicant: Murata Manufacturing Co., Ltd., Nagaokakyo-shi, Kyoto-fu (JP)

(72) Inventors: Yutaka Kishimoto, Nagaokakyo (JP); Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 307 days.

(21) Appl. No.: 15/591,216

(22) Filed: May 10, 2017

(65) Prior Publication Data

US 2017/0358730 A1     Dec. 14, 2017

(30) Foreign Application Priority Data

Jun. 13, 2016   (JP) .................... 2016-117181

(51) Int. Cl.
```
H03H 9/02      (2006.01)
H01L 41/107    (2006.01)
H01L 41/047    (2006.01)
H03H 9/17      (2006.01)
H03H 9/56      (2006.01)
```
(52) U.S. Cl.
CPC ........ *H01L 41/107* (2013.01); *H01L 41/0471* (2013.01); *H03H 9/02574* (2013.01); *H03H 9/02614* (2013.01); *H03H 9/172* (2013.01); *H03H 9/564* (2013.01)

(58) Field of Classification Search
CPC ........... H03H 9/02535; H03H 9/02574; H03H 9/02614; H03H 9/172
USPC ...... 310/313 R, 313 A, 313 B, 313 C, 313 D
See application file for complete search history.

(56) References Cited

U.S. PATENT DOCUMENTS

| | | | |
|---|---|---|---|
| 2005/0200434 A1* | 9/2005 | Takano | ............ H03H 3/08 333/193 |
| 2008/0211602 A1* | 9/2008 | Khelif | ............ H03H 3/04 333/193 |
| 2010/0123367 A1 | 5/2010 | Tai et al. | |
| 2012/0049979 A1* | 3/2012 | Owaki | ............ H03H 9/02551 333/195 |
| 2014/0152145 A1* | 6/2014 | Kando | ............ H03H 3/02 310/313 A |

FOREIGN PATENT DOCUMENTS

JP       2010-154505 A       7/2010

* cited by examiner

*Primary Examiner* — Derek J Rosenau
(74) *Attorney, Agent, or Firm* — Keating & Bennett, LLP (57) ABSTRACT

An elastic wave device in which a recess is provided on an upper side of a support, a piezoelectric thin film covers the recess, and an IDT electrode is provided on an upper surface of the piezoelectric thin film. A plate wave of an S0 mode or SH0 mode is used. A plurality of grooves are provided in the upper surface or lower surface of the piezoelectric thin film at a portion of the piezoelectric thin film that is positioned on a hollow section.

4 Claims, 12 Drawing Sheets

FIG. 16A: $S_0$ MODE LAMB WAVE

FIG. 16B: $S_1$ MODE LAMB WAVE

FIG. 16C: $A_0$ MODE LAMB WAVE

FIG. 16D: $A_1$ MODE LAMB WAVE

FIG. 16E: $SH_0$ MODE

FIG. 16F: $SH_1$ MODE

ELASTIC WAVE DEVICE

CROSS REFERENCE TO RELATED APPLICATIONS

This application claims the benefit of priority to Japanese Patent Application No. 2016-117181 filed on Jun. 13, 2016. The entire contents of this application are hereby incorporated herein by reference.

BACKGROUND OF THE INVENTION

1. Field of the Invention

The present invention relates to elastic wave devices that utilize plate waves propagating in piezoelectric thin films.

2. Description of the Related Art

Elastic wave devices utilizing plate waves are known. For example, Japanese Unexamined Patent Application Publication No. 2010-154505 discloses an elastic wave device utilizing a lamb wave of a plate wave. In the elastic wave device described in Japanese Unexamined Patent Application Publication No. 2010-154505, a frame-shaped support film is laminated on a support substrate. On the support film, a piezoelectric thin film is laminated. An interdigital transducer (IDT) electrode is provided on an upper surface of the piezoelectric thin film.

In order to support various frequency bands in an elastic wave device, an acoustic velocity needs to be changed so as to adjust a frequency. To change the acoustic velocity, the thickness of a piezoelectric thin film needs to be changed. However, in the case of a plate wave such as an S0 mode, SH0 mode, or the like, even if a film thickness of the piezoelectric thin film is changed, the acoustic velocity does not change noticeably.

As such, it is difficult to provide an elastic wave device capable of supporting various frequency bands with a plate wave such as an S0 mode, SH0 mode, or the like.

SUMMARY OF THE INVENTION

Preferred embodiments of the present invention provide an elastic wave device utilizing an S0 or SH0 mode at various acoustic velocities.

An elastic wave device according to a first preferred embodiment of the present invention includes a support in an upper surface of which a recess is provided; a piezoelectric thin film that includes an upper surface and a lower surface, is provided on the support so as to cover the recess of the support, and includes a portion that is positioned on a hollow section including the recess of the support; and an IDT electrode that is provided on the upper surface of the piezoelectric thin film, and includes a plurality of electrode fingers. In the elastic wave device, a plate wave of an S0 or SH0 mode is used, and at the portion of the piezoelectric thin film that is positioned on the hollow section, a plurality of grooves are provided in the upper or lower surface of the piezoelectric thin film so as to extend in a direction in which the electrode fingers of the IDT electrode extend.

An elastic wave device according to a second preferred embodiment of the present invention includes an acoustic multilayer film including a low acoustic impedance film of which acoustic impedance is relatively low and a high acoustic impedance film of which acoustic impedance is relatively high; a piezoelectric thin film including an upper surface and a lower surface and laminated on the acoustic multilayer film; and an IDT electrode including a plurality of electrode fingers and provided on the piezoelectric thin film. In the elastic wave device, a plate wave of an S0 or SH0 mode is used, and a plurality of grooves extending in a direction in which the electrode fingers of the IDT electrode extend are provided in the upper or lower surface of the piezoelectric thin film.

In a certain specific aspect of an elastic wave device according to the preferred embodiments of the present invention, a portion between the grooves adjacent to each other defines a projection extending in a direction in which the electrode fingers of the IDT electrode extend.

In another aspect of an elastic wave device according to a preferred embodiment of the present invention, the plurality of grooves are provided in the lower surface of the piezoelectric thin film, the respective grooves are positioned under the electrode fingers of the IDT electrode, and the projection is positioned under a region between the electrode fingers. In this case, adjusting the height of the projection makes it possible to easily change an acoustic velocity of an SH0 mode, S0 mode, or the like.

In another aspect of an elastic wave device according to a preferred embodiment of the present invention, the respective grooves provided in the lower surface of the piezoelectric thin film may extend under the electrode fingers and extend to reach a lower portion of the region between the electrode fingers adjacent to each other.

In another specific aspect of an elastic wave device according to a preferred embodiment of the present invention, the plurality of grooves are provided in the upper surface of the piezoelectric thin film, the plurality of grooves are each positioned between the electrode fingers of the IDT electrode, and the electrode fingers are each provided on the projection. In this case, adjusting the groove depth makes it possible to easily change an acoustic velocity of an SH0 mode, S0 mode, or the like.

In still another specific aspect of an elastic wave device according to a preferred embodiment of the present invention, the SH0 mode is used, and the width of the projection ranges from no less than about 25% to no more than about 73% of the width of each of the electrode fingers of the IDT electrode, for example. In this case, changing the height of the projection makes it possible to change the acoustic velocity significantly. As such, elastic wave devices with various acoustic velocities can be easily provided. It is more preferable for the width of the projection to range from no less than about 29.8% to no more than about 49% of the width of each of the electrode fingers of the IDT electrode, for example.

In still another specific aspect of an elastic wave device according to a preferred embodiment of the present invention, the SH0 mode is used, and the height of the projection is no more than about 85.7% of the thickness of the piezoelectric thin film, for example. In this case, an acoustic velocity of the SH0 mode is increased.

In still another specific aspect of an elastic wave device according to a preferred embodiment of the present invention, the S0 mode is used, the width of the projection ranges from no less than about 25% to no more than about 73% of the width of each of the electrode fingers of the IDT electrode, and the height of the projection is no less than about 40% of the thickness of the piezoelectric thin film, for example. In this case, an acoustic velocity of the S0 mode is more effectively changed.

In still another specific aspect of an elastic wave device according to a preferred embodiment of the present invention, the S0 mode is used, and the width and height of the projection satisfy one of conditional patterns 1 to 5 in Table 1 given below.

TABLE 1

|  | WIDTH | HEIGHT |
| --- | --- | --- |
| Pattern 1 | no less than about 33% | no more than about 40% |
| Pattern 2 | no less than about 41% | no more than about 50% |
| Pattern 3 | no less than about 49% | no more than about 60% |
| Pattern 4 | no less than about 57% | no more than about 70% |
| Pattern 5 | no less than about 65% | no more than about 80% |

In another specific aspect of an elastic wave device according to a preferred embodiment of the present invention, the S0 mode is used, and the depth of each of the grooves is no more than about 80.0% of the thickness of the piezoelectric thin film, for example. In this case, with the elastic wave device having a hollow structure, an acoustic velocity of the S0 mode is more effectively changed.

In still another specific aspect of an elastic wave device according to a preferred embodiment of the present invention, the SH0 mode is used, and the depth of each of the grooves is no more than about 85.7% of the thickness of the piezoelectric thin film, for example. In this case, with the elastic wave device having a hollow structure, an acoustic velocity of the SH0 mode is more effectively changed.

In another specific aspect of an elastic wave device according to a preferred embodiment of the present invention, the S0 mode is used, and the depth of each of the grooves is no more than about 90.0% of the thickness of the piezoelectric thin film, for example. In this case, with the elastic wave device including an acoustic multilayer film, an acoustic velocity of the S0 mode is more effectively changed.

In still another specific aspect of an elastic wave device according to a preferred embodiment of the present invention, the SH0 mode is used, and the depth of each of the grooves is no more than about 85.7% of the thickness of the piezoelectric thin film, for example. In this case, with the elastic wave device including the acoustic multilayer film, an acoustic velocity of the SH0 mode is more effectively changed.

Various preferred embodiments of the present invention utilizes an S0 or SH0 mode so that elastic wave devices with various acoustic velocities are able to be provided with ease.

The above and other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Hereinafter, the present invention will be clarified through description of specific preferred embodiments of the present invention with reference to the drawings.

It is to be noted that the respective preferred embodiments described in the present specification are merely examples and the configurations thereof can be partly replaced or combined between different preferred embodiments.

First Preferred Embodiment

Figure 1:
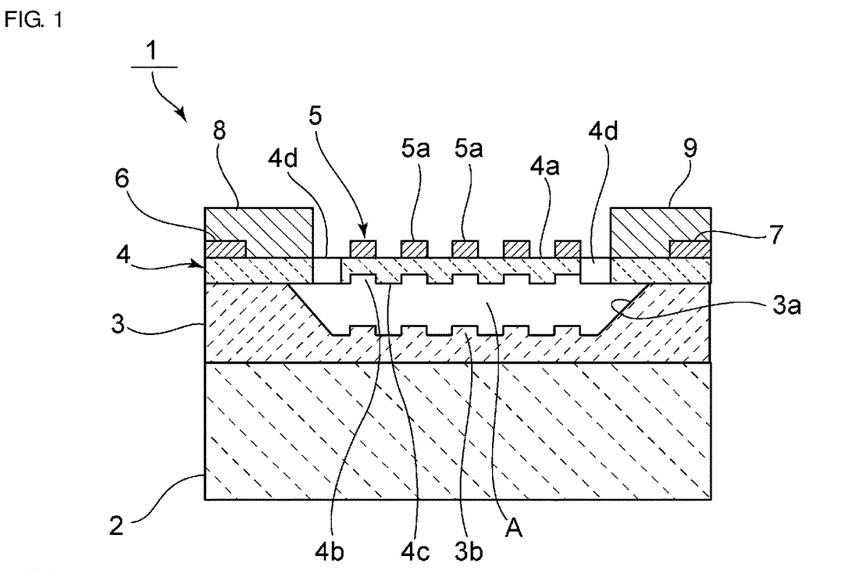
FIG. 1 is a cross-sectional front view of an elastic wave device according to a first preferred embodiment of the present invention.

FIG. 1 is a cross-sectional front view of an elastic wave device according to a first preferred embodiment of the present invention.

An elastic wave device 1 includes a support including a support substrate 2 and a support layer 3. The support layer is provided on the support substrate 2. A recess 3a is provided in an upper surface of the support layer 3. A piezoelectric thin film 4 is laminated on the support layer 3 so as to cover the recess 3a, thus making the inside of the recess 3a be a hollow section A. A portion of the piezoelectric thin film 4 that is positioned on the hollow section A becomes an exciting section.

In the exciting section, an IDT electrode 5 is provided on an upper surface 4a of the piezoelectric thin film 4. The IDT electrode 5 includes a plurality of electrode fingers 5a.

On the piezoelectric thin film 4, a wiring 6 and a wiring 7 are each provided in a region of an outer side portion of the hollow section A. The wiring 6 and the wiring 7 are electrically connected to the IDT electrode 5.

In a lower surface of the piezoelectric thin film 4, a plurality of grooves 4b are provided. The grooves 4b are extended in a direction in which the electrode fingers 5a of the IDT electrode 5 extend. A portion between the grooves 4b adjacent to each other defines a projection 4c that projects downward. The projection 4c is also extended in a direction in which the electrode fingers 5a extend. The directions in which the electrode fingers 5a, the grooves 4b, and the projections 4c respectively extend, as described above, are lengthwise directions thereof. Dimensions along a direction perpendicular or substantially perpendicular to the above lengthwise directions, that is, along an elastic wave propagation direction are taken as widths thereof.

A projection 3b is provided on a bottom surface of the recess 3a of the support layer 3. The projection 3b is formed to define a projection corresponding to the groove 4b in the manufacture process. Note that, however, it is not absolutely necessary to provide the projection 3b.

Second layer wirings 8 and 9 are laminated so as to cover the wirings 6 and 7, respectively.

The piezoelectric thin film 4 is preferably made of a piezoelectric single crystal of $LiNbO_3$, $LiTaO_3$, or the like. A wave length determined by an electrode finger pitch of the IDT electrode 5 is taken as $\lambda$. It is preferable for the thickness of the piezoelectric thin film 4 to be no less than about $0.05\lambda$ and no more than about $1.0\lambda$, for example. Because such thinned piezoelectric thin film 4 is used, plate waves of an S0 mode, SH0 mode, and the like are able to be effectively excited as will be discussed later.

Here, the "plate wave" is, when a wave length of the plate wave to be excited is taken as $1\lambda$, a collective name for various kinds of waves that are excited in the piezoelectric thin film 4 with a film thickness of no more than about $1\lambda$. The method for exciting the plate wave is not limited to any specific one as long as the wave is concentrated in the piezoelectric thin film 4.

In other words, a membrane structure of the present preferred embodiment or the like in which the plate wave is confined only in the piezoelectric thin film 4 may be employed. Further, like in a fifth preferred embodiment or the like, a structure in which a layer that reflects the plate wave is present near the piezoelectric thin film 4, that is, a structure in which an acoustic reflection film is present, for example, may be included.

The membrane structure is a structure in which the piezoelectric thin film 4 is provided on the hollow section A, as illustrated in FIG. 1, for example, and a portion of the piezoelectric thin film 4 that is positioned on the hollow section A becomes an exciting section.

The "plate wave of an S0 mode" is, when a wave length of the plate wave to be excited is taken as $1\lambda$, a collective name for waves whose main components of displacement excited in a piezoelectric thin film with a film thickness of no more than about $1\lambda$ are longitudinal waves.

Further, the "plate wave of an SH0 mode" is, when a wave length of the plate wave to be excited is taken as $1\lambda$, a collective name for waves whose main components of displacement excited in a piezoelectric thin film with a film thickness of no more than about $1\lambda$ are SH (Shear Horizontal) waves.

Figure 16A:
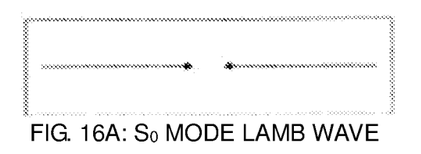
FIGS. 16A to 16D illustrate states of propagation modes of S mode and A mode lamb waves.
Figure 16B:
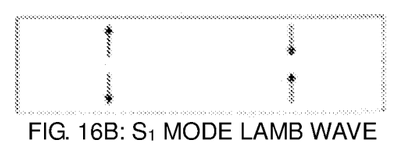
Figure 16C:
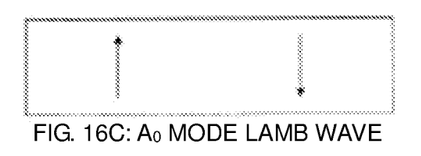
Figure 16D:
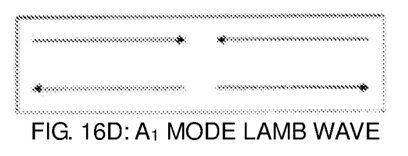
Figure 16E:
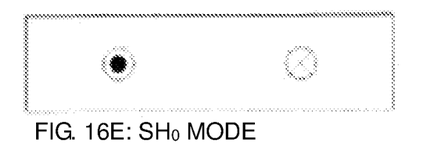
FIGS. 16E and 16F illustrate states of propagation modes of SH waves.
Figure 16F:
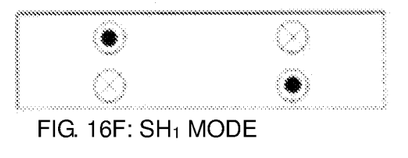

Here, modes in the membrane structure where the plate wave is confined only in the piezoelectric thin film 4 will be described. The plate wave is classified into a lamb wave (main components of which are components in the elastic wave propagation direction and the thickness direction of a piezoelectric material) and an SH wave (main components of which are SH components) in accordance with the displacement components. Further, the lamb wave is classified into a symmetry mode (S mode) and an asymmetry mode (A mode). The symmetry mode is a mode in which pieces of displacement overlap with each other when folded back at a halfway line of the piezoelectric material thickness, while the asymmetry mode is a mode in which pieces of displacement respectively face in opposite directions when folded back at the halfway line of the piezoelectric material thickness. Subscript numeral values indicate the number of nodes in the thickness direction. For example, the lamb wave (plate wave) of an S0 mode is a zero-order symmetry mode lamb wave. The SH wave (plate wave) of an SH0 mode is a zero-order SH wave. FIGS. 16A to 16D illustrate states of propagation modes of the S mode and A mode lamb waves, and FIGS. 16E and 16F illustrate states of propagation modes of the SH waves. In FIGS. 16A to 16D, directions of the arrows respectively indicate principal displacement directions of the elastic waves. Directions perpendicular to the depiction in FIGS. 16E and 16F respectively indicate principal displacement directions of the elastic waves.

The thickness of the piezoelectric thin film 4 is a thickness of a portion of the piezoelectric thin film 4 where the groove 4b or a groove 4e is not present in both the case where the grooves are present in the upper surface, which will be explained later, and the case where the grooves are present in the lower surface.

The IDT electrode 5, the wirings 6 and 7, and the second layer wirings 8 and 9 are made of an appropriate metal or alloy. It is preferable for the IDT electrode 5 to be made of a laminated metal film in which a plurality of metal films are laminated. As the metal of the IDT electrode 5, the wirings 6 and 7, and the second layer wirings 8 and 9, an appropriate metal such as Ag, Cu, Al, Pt, W, Mo, NiCr, Ti or the like, or an appropriate alloy may be used.

The material of the support substrate 2 and the support layer 3 is not limited to any specific one, and an appropriate insulative material can be used preferably. The support may include only the support layer 3.

The elastic wave device 1 preferably includes the plurality of grooves 4b in the lower surface of the piezoelectric thin film 4 and the projection 4c preferably is positioned between the grooves 4b adjacent to each other. The groove 4b opposes the electrode finger 5a in the thickness direction of the piezoelectric thin film 4. In the present preferred embodiment, the width of the groove 4b is equal or substantially equal to that of the electrode finger 5a. Accordingly, the width of the projection 4c is equal or substantially equal to the width of a region between the electrode fingers 5a. Note that, however, in the present invention, it is not absolutely necessary for the width of the groove 4b to be equal to the width of the electrode finger 5a. The groove 4b may reach a portion under the region between the electrode fingers 5a. Further, it is not absolutely necessary for the width of the projection 4c to be equal to the width of the region between the electrode fingers 5a. That is, the width of the projection 4c may be wider than the width of the above-mentioned region, and the projection 4c may reach the lower portion of the electrode finger 5a.

In the elastic wave device 1, because the plurality of grooves 4b are provided, and the portion between the grooves 4b adjacent to each other defines the projection 4c, in the case where an SH0 mode plate wave is used, the acoustic velocity thereof is able to be easily changed. In other words, changing the height, width, or the like of the projection 4c makes it possible to provide the elastic wave device 1 with various acoustic velocities. This will be described below with reference to FIGS. 2 and 3.

Figure 2:
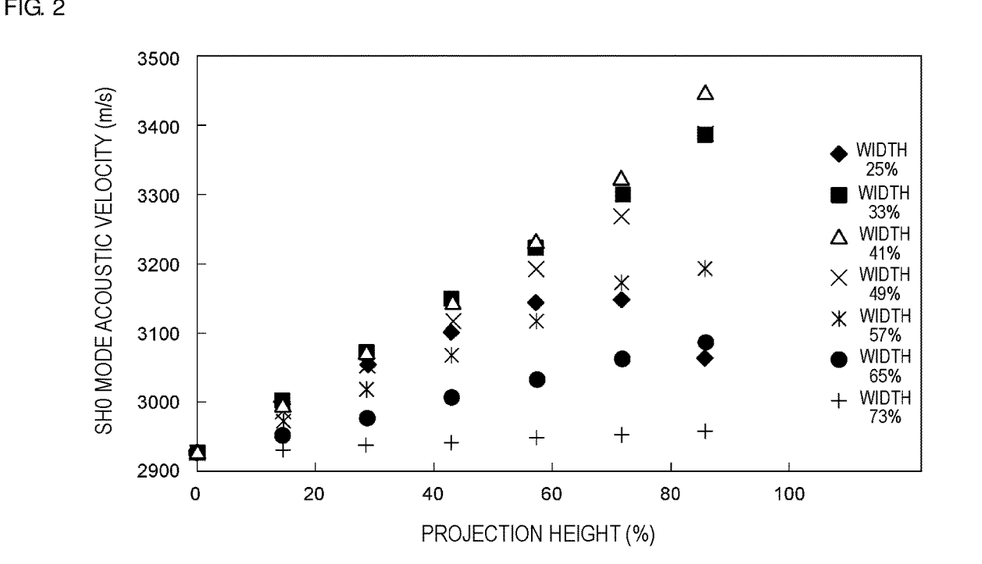
FIG. 2 is a graph illustrating a relationship between an acoustic velocity of an SH0 mode and a height and a width of a projection in the first preferred embodiment of the present invention.
Figure 3:
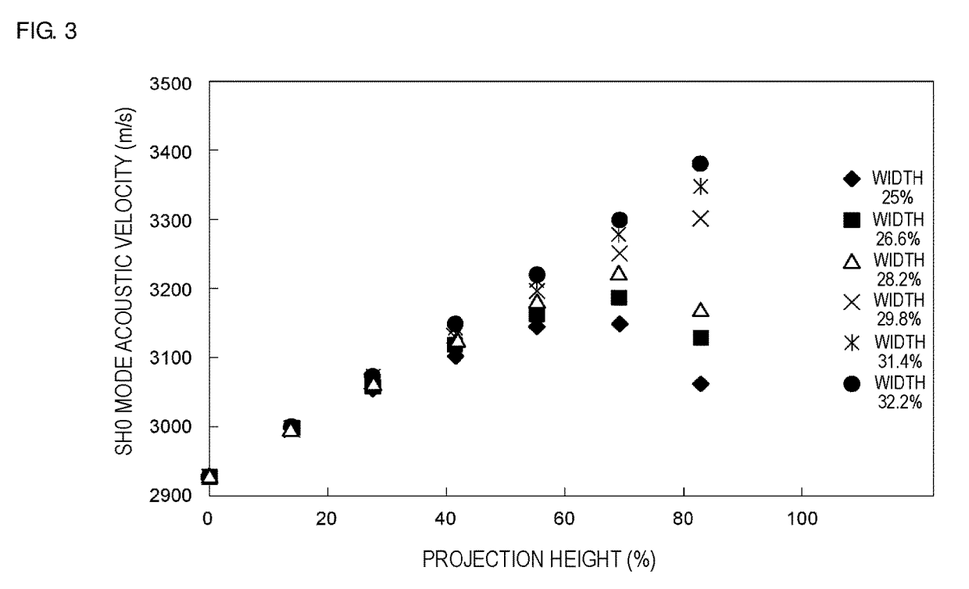
FIG. 3 is another graph illustrating a relationship between an acoustic velocity of an SH0 mode and a height and a width of a projection in the first preferred embodiment of the present invention.

FIG. 2 and FIG. 3 are graphs each illustrating a relationship between the acoustic velocity of the SH0 mode and the height and width of the projection 4c in the elastic wave device 1 of the first preferred embodiment. Note that in the present specification, the acoustic velocity takes a value that is obtained based on a resonant frequency of a one-port type elastic wave resonator.

The height (%) of the projection 4c refers to a ratio (%) of a projecting amount of the projection 4c from the bottom surface of the groove 4b to the thickness of a portion of the piezoelectric thin film 4 where the projection 4c is provided. The width (%) of the projection 4c refers to a ratio (%) of the width of the projection 4c to the width of the electrode finger 5a of the IDT electrode 5.

Here, the piezoelectric thin film 4 preferably is a LiNbO$_3$ film with a thickness of about 0.07λ, for example. An Al film with a thickness of about 0.07λ preferably is used as the IDT electrode 5, for example. Euler angles of the LiNbO$_3$ film preferably are about (0°, 120°, 0°), for example.

As is apparent from FIGS. 2 and 3, increasing the height of the projection 4c makes it possible to largely change the acoustic velocity to be higher. It is also possible to largely change the acoustic velocity by changing the width of the projection 4c. That is, as illustrated in FIG. 2, by increasing the height of the projection within a range where the height thereof is larger than about 0% and smaller than about 100%, the acoustic velocity is able to be largely changed in a direction in which the acoustic velocity is increased. Further, it is understood that, by changing the width of the projection 4c within a range where the width thereof is no less than about 25% and no more than about 73%, for example, the acoustic velocity of the SH0 mode is able to be largely changed. In particular, it is understood that the acoustic velocity is able to be more effectively increased in the case where the width of the projection is no less than about 29.8% and no more than about 49%, for example.

Moreover, as is apparent from FIG. 3, in a range in which the height of the projection 4c exceeds about 60% and is smaller than about 100%, even if the width of the projection is changed within a narrow range where the width thereof is no less than about 25% and no more than about 32.2%, for example, it is understood that the acoustic velocity can be largely changed. Accordingly, the acoustic velocity is able to be effectively changed with a slight shape change by making the width of the projection be no less than about 25% and no more than about 32.2% within a range where the height of the projection is no less than about 60% and smaller than about 100%, for example.

Further, by making the height of the projection be no more than about 85.7% of the thickness of the piezoelectric thin film, for example, the acoustic velocity is able to be effectively increased.

It has been technically difficult for an elastic wave device utilizing an SH0 mode plate wave to increase the acoustic velocity on the assumption that a piezoelectric thin film with a thickness of about 0.05λ to about 1.0λ is used, for example. However, the inventors of the invention of the present application have discovered that the acoustic velocity is able to be increased also in an elastic wave device utilizing an SH0 mode plate wave by forming grooves in a lower surface of a thinned piezoelectric thin film with a thickness of about 0.05λ to 1.0λ, for example.

The following can be cited as advantages of being capable of increasing the acoustic velocity: the frequency is able to be increased even under a condition where the pitch of the IDT electrode is fixed, and the like.

Hereinafter, a non-limiting example of a manufacturing method for the elastic wave device 1 will be described with reference to FIG. 4A through FIG. 6B.

Figure 4A:
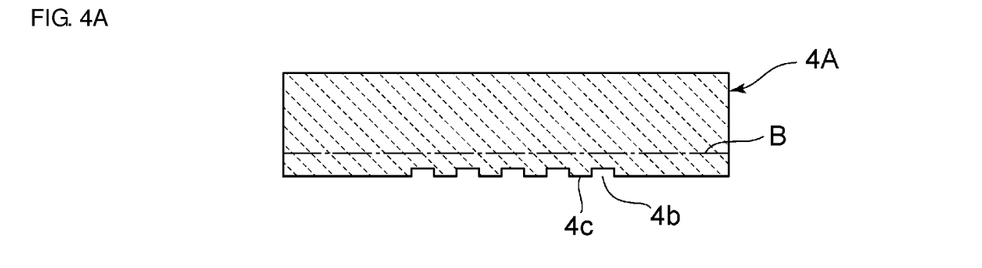
FIGS. 4A to 4D are cross-sectional front views for explaining a manufacturing method for the elastic wave device of the first preferred embodiment of the present invention.

First, as illustrated in FIG. 4A, a piezoelectric substrate 4A made of LiNbO$_3$ is prepared. The plurality of grooves 4b and the plurality of projections 4c each positioned between the grooves 4b are formed by reactive ion etching or the like in one surface of the piezoelectric substrate 4A.

Note that in FIG. 4A, a dot-dash line B corresponds to a position of the upper surface of the last-stage piezoelectric thin film 4.

Figure 4B:
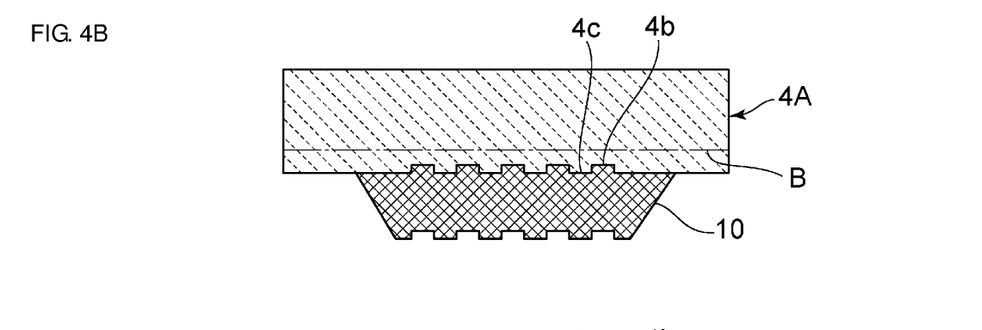

Next, as illustrated in FIG. 4B, a sacrificial layer covers the grooves 4b and the projections 4c. As the material of the sacrificial layer 10, a material that can be eluted by a mixed solution to be explained later can be used. In the present preferred embodiment, ZnO is preferably used, for example.

Figure 4C:
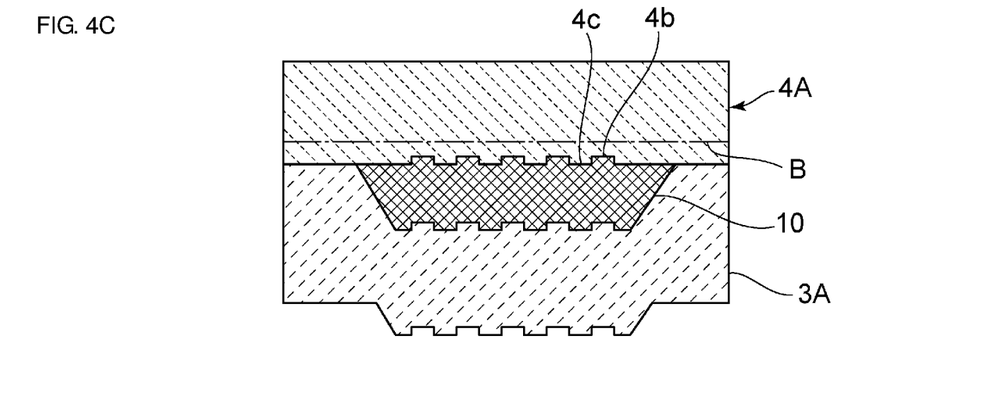
Figure 4D:
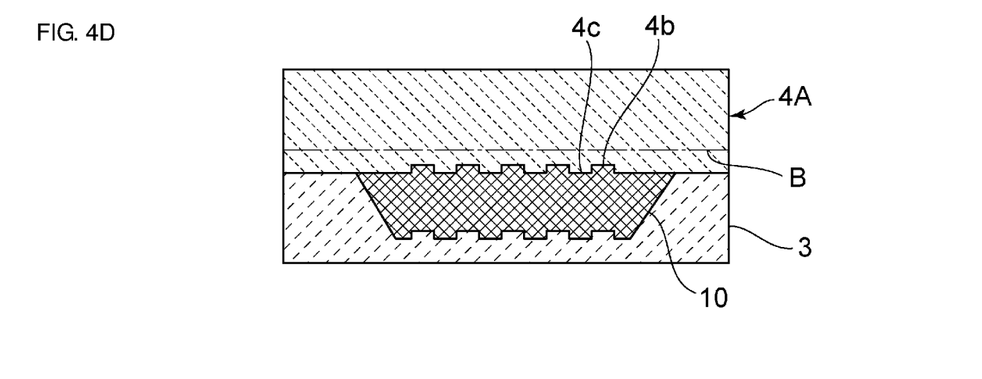

Next, as illustrated in FIG. 4C, a support layer 3A is laminated so as to cover the sacrificial layer 10. As the support layer 3A, a SiO$_2$ film is deposited by a deposition method. Subsequently, as illustrated in FIG. 4D, a lower surface of the support layer 3A experiences the CMP or the like to be flattened. As a result, the support layer 3 is formed.

Figure 5A:
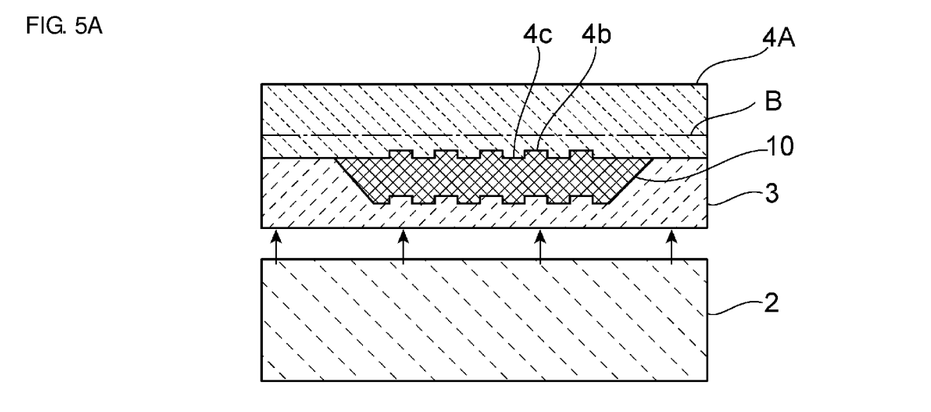
FIGS. 5A to 5C are cross-sectional front views for explaining the manufacturing method for the elastic wave device of the first preferred embodiment of the present invention.
Figure 5B:
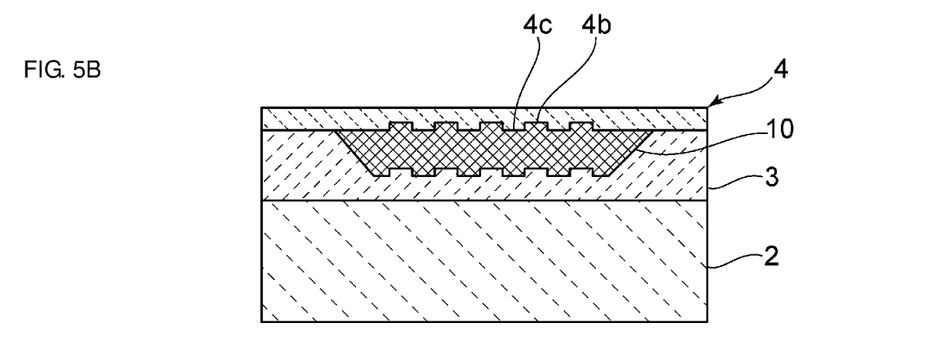

Next, as illustrated in FIG. 5A, the support substrate 2 is bonded to the support layer 3. Thereafter, the Smart-Cut is performed on the piezoelectric substrate 4A so that the piezoelectric substrate 4A is thinned to a level of the dot-dash line B as illustrated in FIG. 5A. Through this, the piezoelectric thin film 4 is obtained as illustrated in FIG. 5B. The piezoelectric thin film 4 may be obtained by grinding the piezoelectric substrate 4A.

Figure 5C:
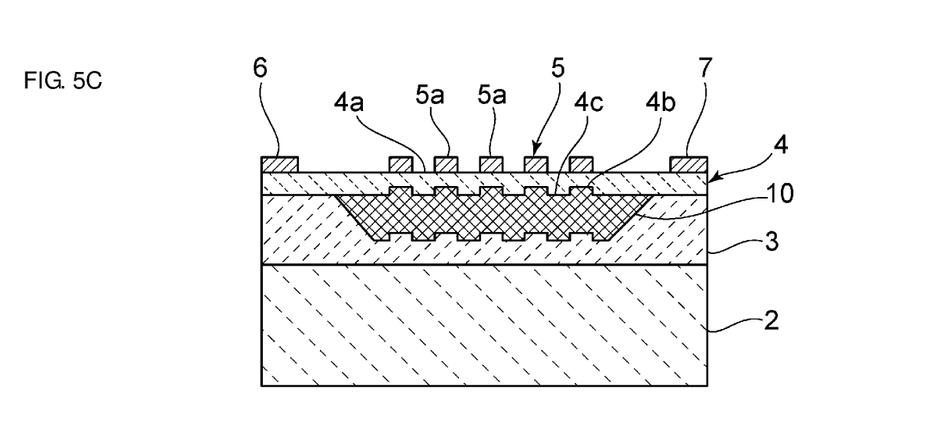

The IDT electrode 5 and the wirings 6, 7 are formed, as illustrated in FIG. 5C, by an evaporation and liftoff method.

Figure 6A:
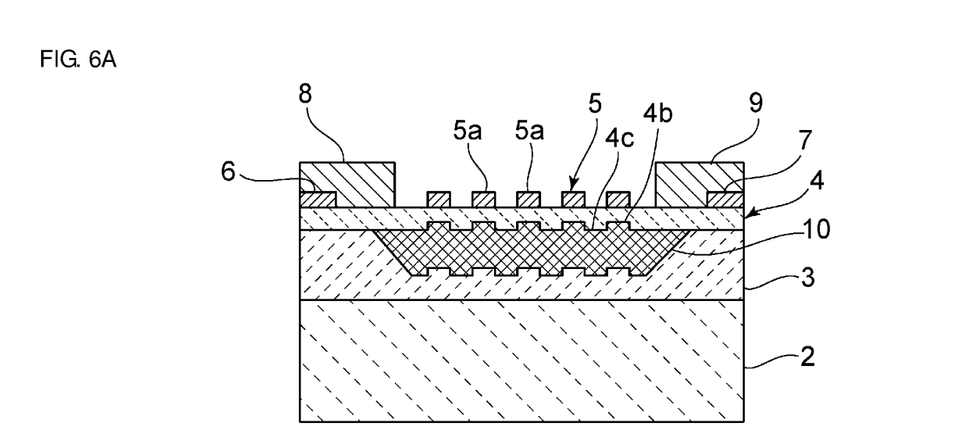
FIGS. 6A and 6B are cross-sectional front views for explaining the manufacturing method for the elastic wave device of the first preferred embodiment of the present invention.
Figure 6B:
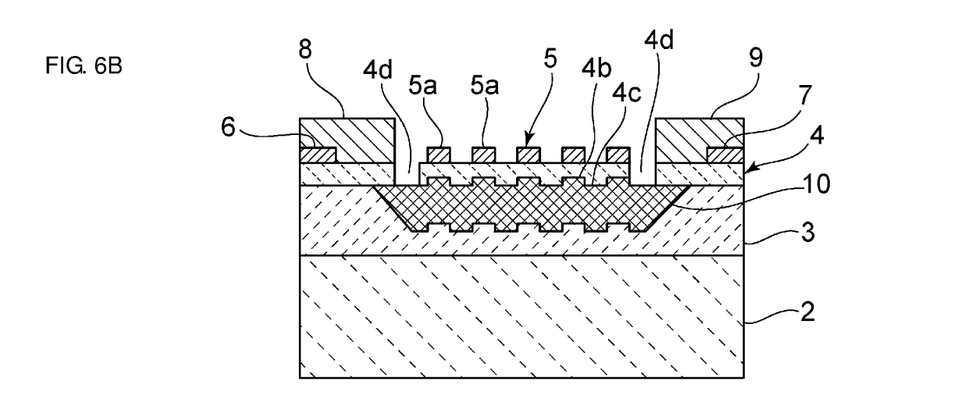

Thereafter, as illustrated in FIG. 6A, the second layer wirings 8 and 9 are formed by the evaporation and liftoff method. Subsequently, as illustrated in FIG. 6B, etching holes 4d are formed in the piezoelectric thin film 4. The etching holes 4d can be formed by dry etching or the like.

Thereafter, the sacrificial layer 10 is removed by wet etching. In the wet etching, an appropriate mixed solution that can elute the sacrificial layer 10 is used. For example, a mixed solution containing acetic acid, phosphoric acid, and water in a ratio by weight of about 1:1:10 can be used.

In this manner, the material of the sacrificial layer is eluted through the etching holes 4d. With this, the elastic wave device 1 illustrated in FIG. 1 can be obtained.

Second Preferred Embodiment

Figure 7:
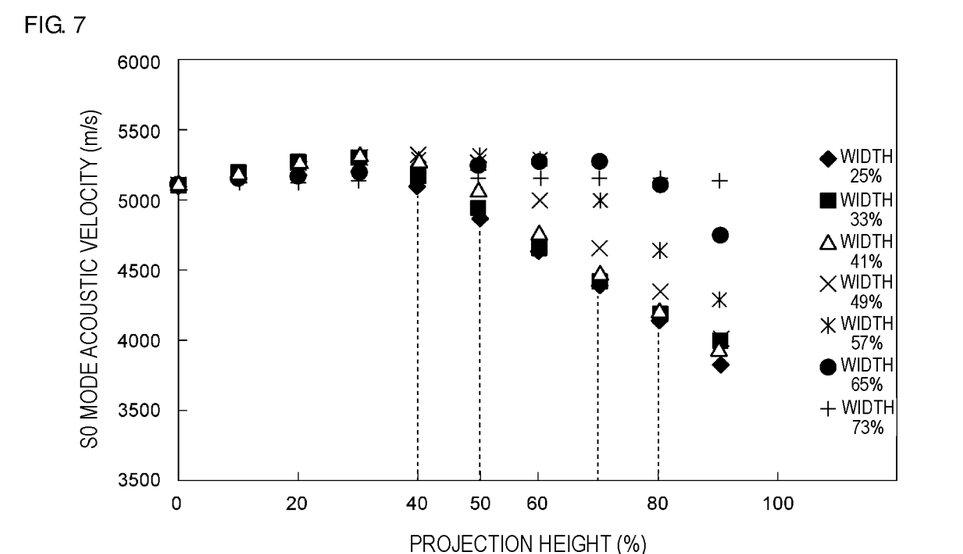
FIG. 7 is a graph illustrating a relationship between an acoustic velocity of an S0 mode and a height and a width of a projection in an elastic wave device of a second preferred embodiment of the present invention.

An elastic wave device according to a second preferred embodiment of the present invention preferably has the same or similar structure as the elastic wave device 1 of the first preferred embodiment except that an S0 mode as a plane wave is used. Note that, however, in order to excite the S0 mode effectively, a LiNbO$_3$ substrate with Euler angles being about (90°, 90°, 40°) is used as the piezoelectric thin film 4. Further, the thickness of the piezoelectric thin film 4 made of LiNbO$_3$ is preferably about 0.1λ, and an Al film with a thickness of about 0.07λ is preferably used as the IDT electrode 5, for example. FIG. 7 illustrates a relationship between the acoustic velocity of the S0 mode and the height (%) and width (%) of the projection 4c in this case.

Like in FIG. 2, the height (%) of the projection in FIG. 7 refers to a ratio of the height of the projection 4c to the thickness of the piezoelectric thin film 4. In other words, it is a ratio (%) of the height of the projection 4c to the thickness of the piezoelectric thin film 4 at a portion where the projection 4c is positioned. The width (%) of the projection 4c refers to a ratio (%) of the width of the projection 4c to the width of the electrode finger 5a of the IDT electrode 5.

As is apparent from FIG. 7, also in the case of using the S0 mode, it is understood that the acoustic velocity of the S0 mode largely changes when the height and width of the projection 4C change. In other words, the acoustic velocity largely changes in a range in which the height of the projection 4c is larger than about 0% and smaller than about 100%. Further, it is also understood that, when the width of the projection 4c changes within a range where the width of the projection 4c is no less than about 25% and no more than about 73%, the acoustic velocity largely changes, for example. Furthermore, it is understood that the acoustic velocity of the S0 mode is more effectively changed when the width of the projection 4c is changed in the case where the height of the projection 4c is preferably no less than about 40%, more preferably no less than about 40% and no more than about 90%, and further more preferably no less than about 50% and no more than about 90%, for example. In addition, it is understood that the acoustic velocity of the S0 mode largely changes in the case where the width of the projection 4c is no less than about 33% and no more than about 73%, for example.

Moreover, as is apparent from FIG. 7, it is understood that the acoustic velocity is able to be effectively increased when the S0 mode is used in the following case: a case in which the width of the projection 4c is no less than about 33% and the height of the projection 4c is no more than about 40%; a case in which the width of the projection 4c is no less than about 41% and the height of the projection 4c is no more than about 50%; a case in which the width of the projection 4c is no less than about 49% and the height of the projection 4c is no more than about 60%; a case in which the width of the projection 4c is no less than about 57% and the height of the projection 4c is no more than about 70%; or a case in which the width of the projection 4c is no less than about 65% and the height of the projection 4c is no more than about 80%, for example.

As such, it is desirable for the width and height of the projection to satisfy one of patterns 1 to 5 in Table 2 given below.

TABLE 2

|  | WIDTH | HEIGHT |
|---|---|---|
| Pattern 1 | no less than about 33% | no more than about 40% |
| Pattern 2 | no less than about 41% | no more than about 50% |
| Pattern 3 | no less than about 49% | no more than about 60% |
| pattern 4 | no less than about 57% | no more than about 70% |
| Pattern 5 | no less than about 65% | no more than about 80% |

It has been technically difficult for an elastic wave device utilizing an S0 mode plate wave to increase the acoustic velocity on the assumption that a piezoelectric thin film with a thickness of about 0.05λ to about 1.0λ is used, for example. However, the inventors of the invention of the present application have discovered that the acoustic velocity is able to be increased also in an elastic wave device utilizing an S0 mode plate wave by forming grooves in a lower surface of a thinned piezoelectric thin film with a thickness of about 0.05λ to about 1.0λ, for example.

The following can be cited as advantages of being capable of increasing the acoustic velocity: the frequency is able to be increased even under a condition where the pitch of the IDT electrode is fixed, and the like.

As such, also in the case of using the S0 mode, changing the height and width of the projection 4c makes it possible to effectively change the acoustic velocity of the S0 mode. Accordingly, elastic wave devices with various acoustic velocities are able to be provided by controlling the height and width of the projections 4c.

Third Preferred Embodiment

Figure 8:
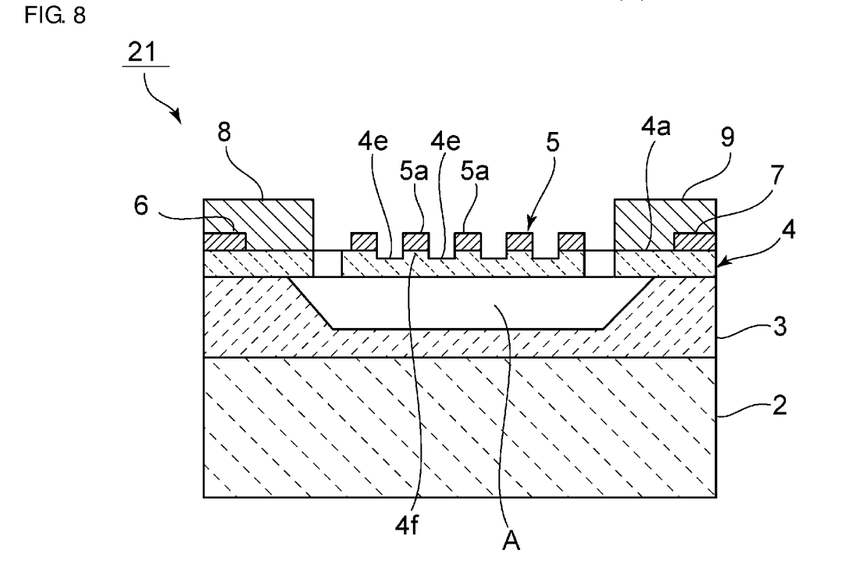
FIG. 8 is a cross-sectional front view of an elastic wave device according to a third preferred embodiment of the present invention.

FIG. 8 is a cross-sectional front view of an elastic wave device according to a third preferred embodiment of the present invention.

An elastic wave device 21 is provided with a plurality of grooves 4e in an upper surface 4a of a piezoelectric thin film 4. A portion between the grooves 4e adjacent to each other defines a projection 4f. Electrode fingers 5a of an IDT electrode 5 are each positioned on the projection 4f. On the other hand, grooves or projections are not provided in a lower surface of the piezoelectric thin film 4. A bottom surface of a support layer 3 facing a hollow section A is flattened. Other elements of the elastic wave device 21 are preferably the same or similar to those of the elastic wave device 1.

The plurality of grooves 4e are each provided at a region between the electrode fingers 5a of the IDT electrode 5. Meanwhile, the projection 4f is provided immediately under the electrode finger 5a. In the present preferred embodiment, the grooves 4e preferably have the same width as that of the region between the electrode fingers 5a adjacent to each other. The width of the projection 4f is equal or substantially equal to that of the electrode finger 5a of the IDT electrode 5. Note that, however, the projection 4f may have a wider width than the electrode finger 5a. In other words, the projection 4f may reach the region between the electrode fingers 5a adjacent to each other. In this case, the width of the groove 4e becomes smaller than the width of the region between the electrode fingers 5a.

Because, in the elastic wave device 21, the plurality of grooves 4e and the plurality of projections 4f are provided in the upper surface 4a of the piezoelectric thin film 4 as discussed above, the elastic wave device 21 with various acoustic velocities of S0 modes is able to be obtained. This will be described below with reference to FIG. 9.

Figure 9:
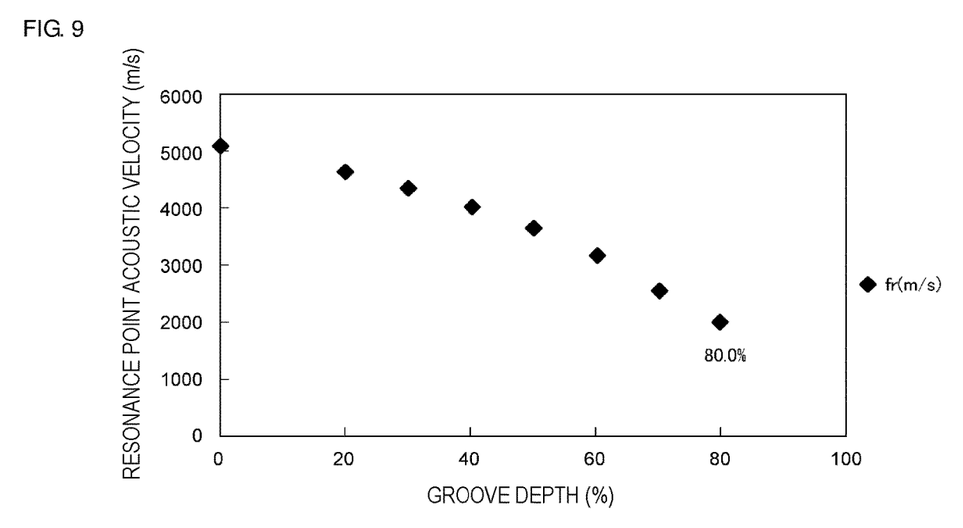
FIG. 9 is a graph illustrating a relationship between a groove depth and an acoustic velocity of an S0 mode in the third preferred embodiment of the present invention.

FIG. 9 is a graph illustrating a change in an acoustic velocity of an S0 mode when a depth (%) of the groove 4e of the third preferred embodiment is changed. Here, Euler angles of the piezoelectric thin film 4 made of LiNbO$_3$ are about (90°, 90°, 40°), and the film thickness thereof is about 0.1λ, for example. The IDT electrode 5 is made of an Al film of about 0.07λ, for example. Note that in FIG. 9, and FIGS. 12, 14 and 15 to be described later, the depth (%) of the groove 4e refers to a ratio (%) of the groove depth to the thickness of the piezoelectric thin film at a portion where no groove is present.

As is apparent from FIG. 9, in the case where a wave length determined by an electrode finger pitch of the IDT electrode 5 is taken as λ, the acoustic velocity of the S0 mode largely changes when the depth of the groove 4e changes.

As is also apparent from FIG. 9, it is understood that the acoustic velocity changes when the groove 4e is present. More preferably, the acoustic velocity of the S0 mode is able to be significantly changed in the case where the depth of the groove 4e is set to be no more than about 80.0% of the thickness of the piezoelectric thin film, for example. As such, the elastic wave device 21 with various acoustic velocities is able to be obtained with ease.

Figure 10A:
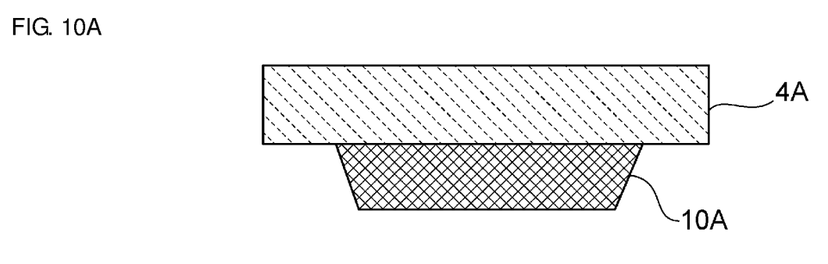
FIGS. 10A to 10D are cross-sectional front views for explaining a manufacturing method for the elastic wave device according to the third preferred embodiment of the present invention.

Next, a non-limiting example of a manufacturing method for the elastic wave device 21 will be described with reference to FIGS. 10A through 11C. First, as illustrated in FIG. 10A, a sacrificial layer 10A is formed on one surface of a piezoelectric substrate 4A made of LiNbO$_3$. The sacrificial layer 10A can be formed using the same material as the above-described sacrificial layer 10.

Figure 10B:
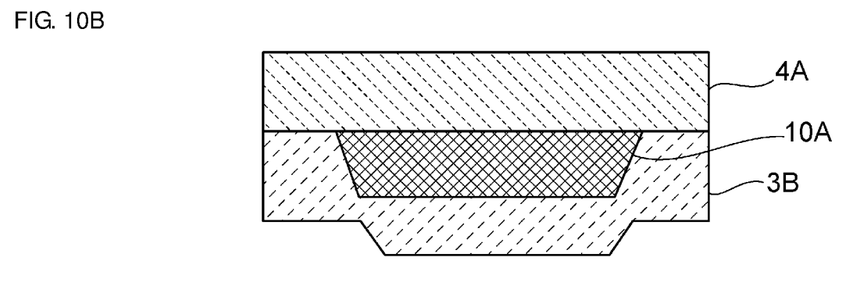

Next, as illustrated in FIG. 10B, a support layer 3B is so formed as to cover the sacrificial layer 10A.

Figure 10C:
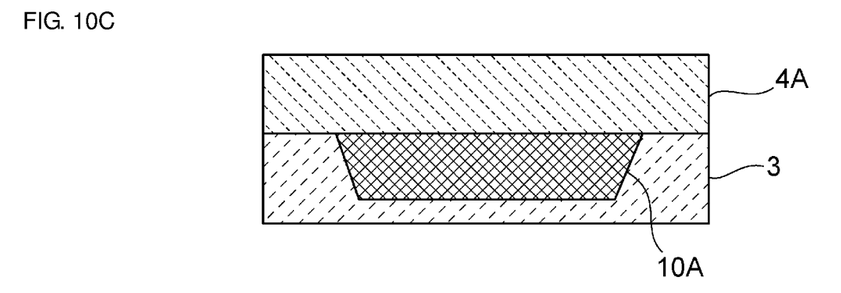

Thereafter, as illustrated in FIG. 10C, the support layer 3B is ground by CMP processing or the like to obtain a support layer 3 whose lower surface is flattened.

Figure 10D:
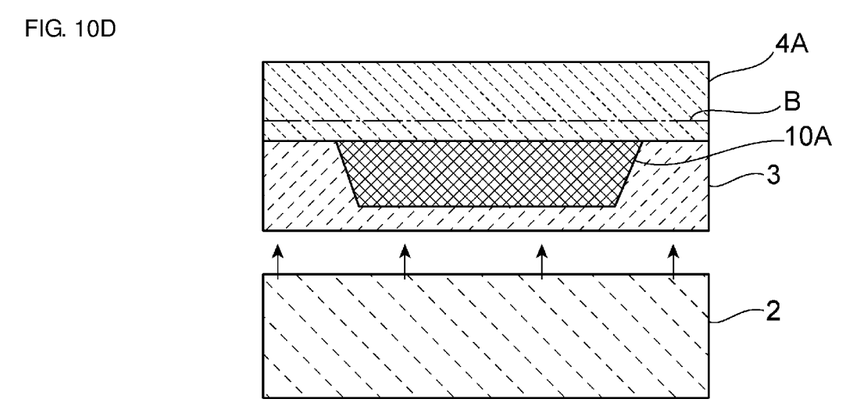

Next, as illustrated in FIG. 10D, a support substrate 2 is bonded to the support layer 3.

Figure 11A:
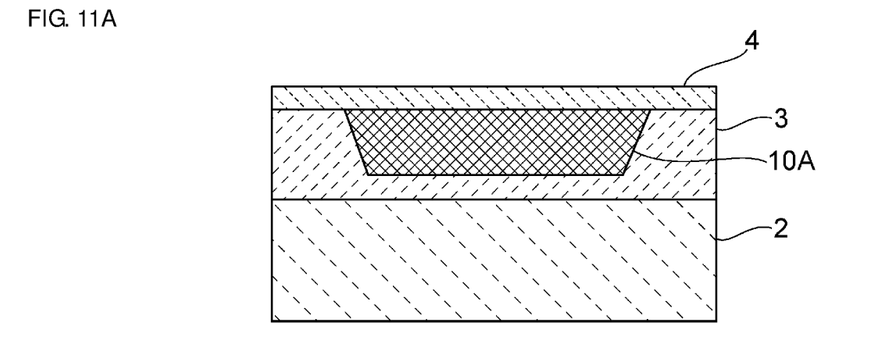
FIGS. 11A to 11C are cross-sectional front views for explaining the manufacturing method for the elastic wave device of the third preferred embodiment of the present invention.

Next, the Smart-Cut is performed on the piezoelectric substrate 4A so that the piezoelectric substrate 4A is thinned to a position of a dot-dash line B. Through this, the piezoelectric thin film 4 is obtained as illustrated in FIG. 11A.

Figure 11B:
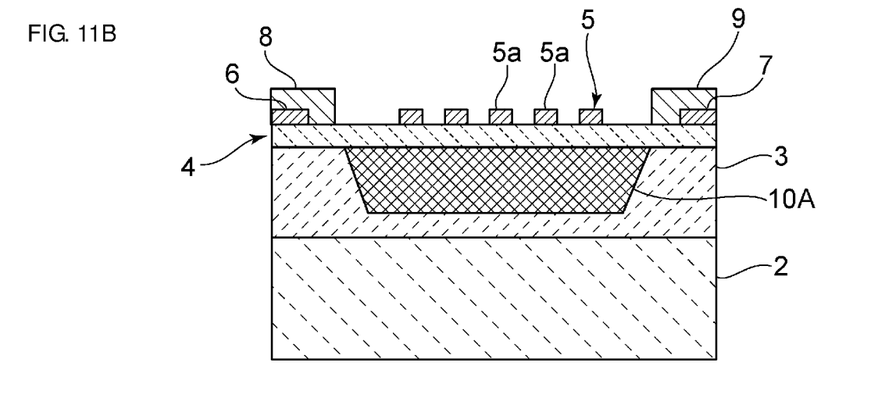

Next, as illustrated in FIG. 11B, the IDT electrode 5, wirings 6 and 7, and second layer wirings 8, 9 are provided on the piezoelectric thin film 4 by an evaporation liftoff method or the like.

Figure 11C:
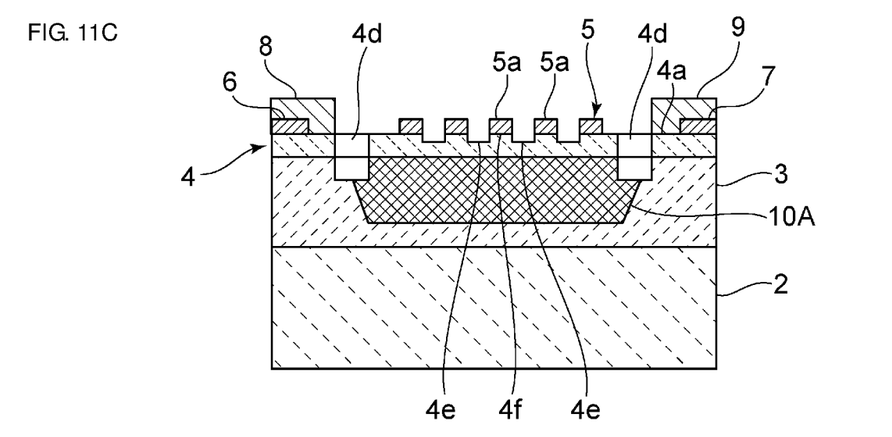

Next, etching holes 4d are provided by dry etching as illustrated in FIG. 11C. Thereafter, like in the case of the elastic wave device 1, the sacrificial layer 10A is eluted by wet etching. Through this, the elastic wave device 21 is able to be obtained.

Fourth Preferred Embodiment

An elastic wave device according to a fourth preferred embodiment of the present invention is the same in the configuration as the elastic wave device 21 except that an SH0 mode is used therein. As such, the description of the elastic wave device 21 will be quoted hereinafter.

Figure 12:
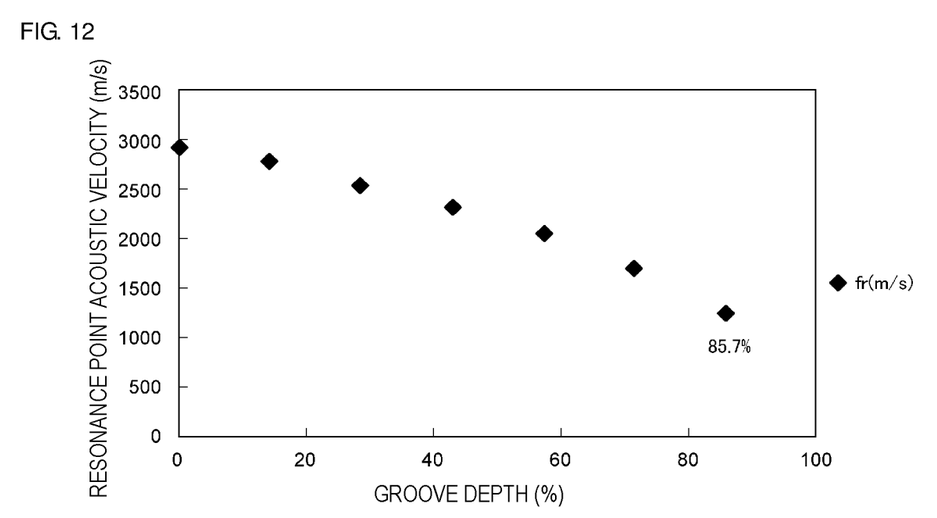
FIG. 12 is a graph illustrating a relationship between a groove depth and an acoustic velocity of an SH0 mode in a fourth preferred embodiment of the present invention.

FIG. 12 is a graph illustrating a relationship between a depth of the groove 4e and an acoustic velocity in the case where an SH0 mode plate wave is used in the fourth preferred embodiment. Here, Euler angles of the piezoelectric thin film 4 made of LiNbO$_3$ are about (0°, 120°, 0°), and a film thickness thereof is about 0.07λ, for example. Further, the IDT electrode 5 is made of an Al film with a thickness of about 0.07λ.

As is apparent from FIG. 12, it is understood that the acoustic velocity changes when the groove 4e is present. More preferably, the acoustic velocity of the SH0 mode largely changes in the case where the depth of the groove 4e is set to be no more than about 85.7% of the thickness of the piezoelectric thin film, for example. Accordingly, controlling the depth of the groove 4e makes it possible to obtain the elastic wave device 21 with various acoustic velocities.

Fifth Preferred Embodiment

Figure 13:
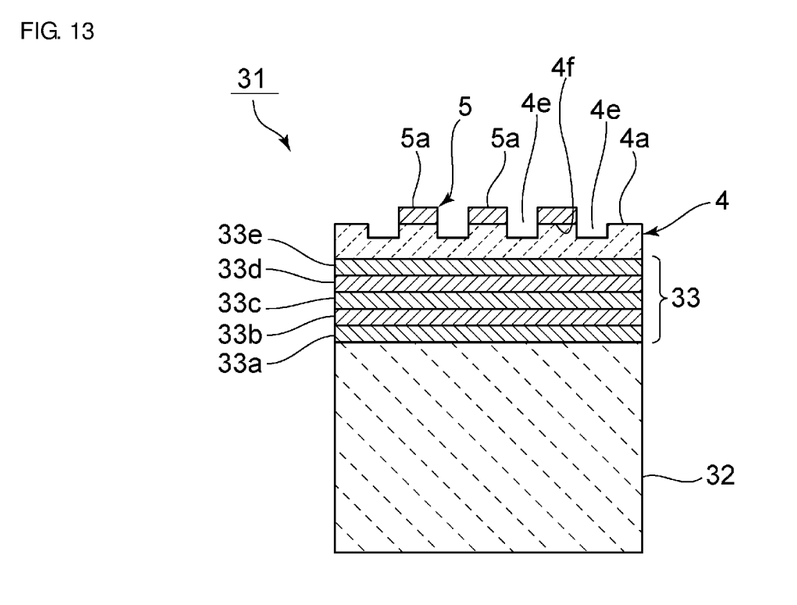
FIG. 13 is a cross-sectional front view illustrating an elastic wave device according to a fifth preferred embodiment of the present invention.

FIG. 13 is a cross-sectional front view of an elastic wave device according to a fifth preferred embodiment of the present invention.

An acoustic multilayer film 33 is laminated on a support substrate 32 in an elastic wave device 31 of the fifth preferred embodiment. A piezoelectric thin film 4 is laminated on the acoustic multilayer film 33. An IDT electrode 5 is provided on an upper surface 4a of the piezoelectric thin film 4. The IDT electrode 5 includes a plurality of electrode fingers 5a.

The elastic wave device 31 differs from the elastic wave device 21 in that the support layer 3 is not provided but the acoustic multilayer film 33 is provided instead. Other structural elements of the elastic wave device 31 are the same as those of the elastic wave device 21. As such, corresponding portions are given the corresponding reference numerals, thus omitting description thereof.

Accordingly, a plurality of grooves 4e are provided in the upper surface 4a of the piezoelectric thin film 4. A portion between the grooves 4e adjacent to each other defines a projection 4f.

The acoustic multilayer film 33 has a structure in which low acoustic impedance films 33a, 33c and 33e, and high acoustic impedance films 33b and 33d are alternately laminated. The low acoustic impedance films 33a, 33c, and 33e are each made of a material whose acoustic impedance is relatively high compared to the high acoustic impedance films 33b and 33d. Accordingly, for example, SiO$_2$ is able to be used as a material of the low acoustic impedance films 33a, 33c, and 33e, while SiN, Pt, or the like can be used as a material of the high acoustic impedance films 33b and 33d. The material of the low acoustic impedance films 33a, 33c and 33e, and the material of the high acoustic impedance films 33b and 33d are not limited to any specific ones as long as the above-mentioned acoustic impedance relationship is satisfied.

The number of laminated layers of the low acoustic impedance films and high acoustic impedance films is not limited to any specific number.

Because the piezoelectric thin film 4 is laminated on the acoustic multilayer film 33, an elastic wave such as a plate wave or the like is able to be confined effectively in the piezoelectric thin film 4. Therefore, it is unnecessary to provide the hollow section A that is used in the elastic wave device 1.

In the manufacture of the elastic wave device 31, the acoustic multilayer film 33 is deposited by a deposition method on the support substrate 32. Then, after the piezoelectric substrate is bonded onto the acoustic multilayer film 33, the piezoelectric substrate is thinned by the CMP or the like. After obtaining the piezoelectric thin film 4 in the manner discussed above, the IDT electrode 5 is formed by the evaporation lift method or the like. Thereafter, it is sufficient to provide the grooves 4e by etching.

Film thicknesses of the low acoustic impedance films 33a, 33c and 33e, and the high acoustic impedance films 33b and 33d are not limited to any specific ones, and it is sufficient for the film thicknesses thereof to be about 100 nm to about 1000 nm, for example.

Here, in the elastic wave device 31, an acoustic velocity of an S0 mode plate wave changes when the depth of the groove 4e is changed, which will be explained below with reference to FIG. 14.

Euler angles of the piezoelectric thin film 4 made of LiNbO$_3$ are about (90°, 90°, 40°), and the film thickness thereof is about 0.2λ, for example. The IDT electrode 5 is made of an Al film with a thickness of about 0.047λ, for example. The acoustic multilayer film 33 includes five layers in which a SiO$_2$ film (thickness is about 0.14λ), a Pt film (thickness is about 0.09λ), a SiO$_2$ film (thickness is about 0.14λ), a Pt film (thickness is about 0.09λ), and a SiO$_2$ film (thickness is about 0.14λ) are sequentially laminated in that order from the piezoelectric thin film 4 side so as to form a multilayer body, for example. The support substrate 32 preferably is a Si substrate.

Figure 14:
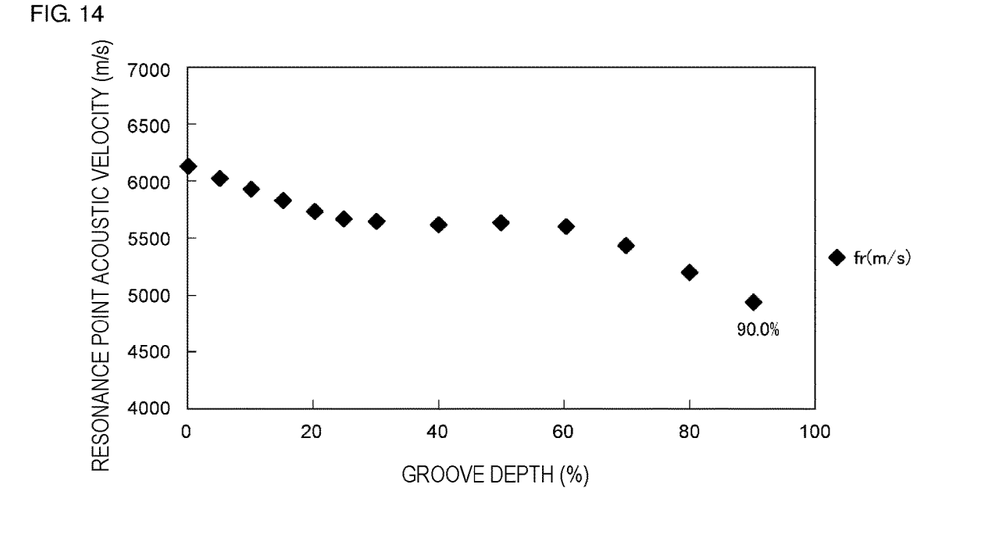
FIG. 14 is a graph illustrating a relationship between a groove depth and an acoustic velocity of an S0 mode in the fifth preferred embodiment of the present invention.

FIG. 14 is a graph illustrating a relationship between the groove depth of the groove 4e and the acoustic velocity of the S0 mode. As is apparent from FIG. 14, it is understood that the acoustic velocity changes when the groove 4e is present. More preferably, in the case where the depth of the groove 4e is set to be no more than about 90.0% of the thickness of the piezoelectric thin film 4, it is understood that the S0 mode acoustic velocity largely changes.

Sixth Preferred Embodiment

Figure 15:
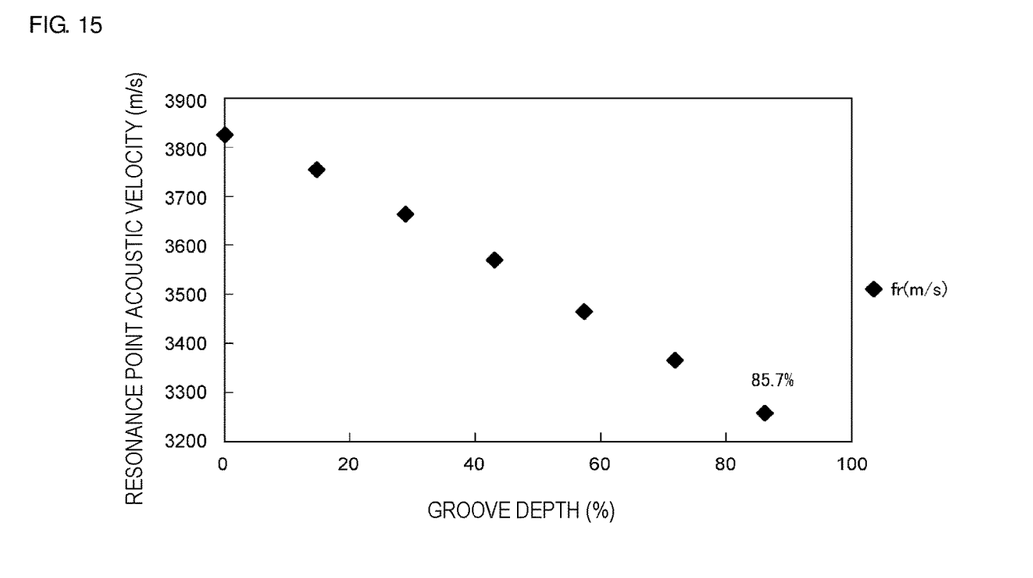
FIG. 15 is a graph illustrating a relationship between a groove depth and an acoustic velocity of an SH0 mode in a sixth preferred embodiment of the present invention.

An elastic wave device according to a sixth preferred embodiment of the present invention preferably has the same structure as the elastic wave device 31 of the fifth preferred embodiment. However, in the sixth preferred embodiment, an SH0 mode is used as a plate wave. Also with the elastic wave device 31, by adjusting the Euler angles of the piezoelectric thin film 4 made of LiNbO$_3$, the SH0 mode is able to be effectively used. FIG. 15 is a graph illustrating a relationship between a groove depth (%) and an acoustic velocity of the SH0 mode. As the piezoelectric thin film 4 made of LiNbO$_3$, used is a LiNbO$_3$ film with Euler angles of about (0°, 120°, 0°) and with a thickness of about 0.07λ, for example. The IDT electrode 5 is made of an Al film of about 0.08λ, for example. The acoustic multilayer film 33 uses a multilayer body in which a SiO$_2$ film (thickness is about 0.20λ), a Pt film (thickness is about 0.18λ), a SiO$_2$ film (thickness is about 0.20λ), a Pt film (thickness is about 0.18λ), and a SiO$_2$ film (thickness is about 0.20λ) are sequentially laminated in that order from the piezoelectric thin film 4 side, for example. The support substrate 32 preferably is a Si substrate.

As illustrated in FIG. 15, it is understood that the acoustic velocity changes when the groove 4e is present. More preferably, in the case where the depth of the groove 4e is set to be no more than about 85.7% of the thickness of the piezoelectric thin film 4, the SH0 mode acoustic velocity largely drops. Accordingly, controlling the groove depth of the groove 4e makes it possible to provide the elastic wave device 31 with various acoustic velocities of SH0 modes.

As is apparent from FIG. 15, also in the case of using the SH0 mode, elastic wave devices with various acoustic velocities are able to be provided as the elastic wave device 31.

In various preferred embodiments of the present invention, a structure utilizes an S0 mode or SH0 mode propagating in a piezoelectric thin film, and grooves and projections are provided in one surface of the piezoelectric thin film. As such, the configuration of an IDT electrode, the number of IDT electrodes, and the like are not limited to any specific ones. Accordingly, preferred embodiments of the present invention are applicable to not only to elastic wave resonators but also widely applied to elastic wave filters and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a support including an upper surface with a recess;
a piezoelectric thin film that includes an upper surface and a lower surface, is provided on the support so as to cover the recess, and includes a portion that is positioned on a hollow section including the recess; and
an IDT electrode that is provided on the upper surface of the piezoelectric thin film, and includes a plurality of electrode fingers; wherein
the elastic wave device is structured to generate a plate wave of an SH0 mode;
at the portion of the piezoelectric thin film that is positioned on the hollow section, a plurality of grooves are provided in the upper or lower surface of the piezoelectric thin film so as to extend in a direction in which the electrode fingers of the IDT electrode extend;
a thickness of the piezoelectric thin film is no less than about 0.05λ and no more than about 1.0λ, where λ is a wave length determined by an electrode finger pitch of the IDT electrode;
a portion between the grooves adjacent to each other defines a projection extending in a direction in which the electrode fingers of the IDT electrode extend;
the plurality of grooves are provided in the lower surface of the piezoelectric thin film;
the respective grooves are positioned under the electrode fingers of the IDT electrode;
the projection is positioned under a region between the electrode fingers; and
a width of the projection ranges from no less than about 25% to no more than about 73% of a width of each of the electrode fingers of the IDT electrode.

2. The elastic wave device according to claim 1, wherein the respective grooves provided in the lower surface of the piezoelectric thin film extend under the electrode fingers and extend to reach a lower portion of the region between the electrode fingers adjacent to each other.

3. The elastic wave device according to claim 1, wherein the width of the projection ranges from no less than about 29.8% to no more than about 49% of the width of each of the electrode fingers of the IDT electrode.

4. The elastic wave device according to claim 1, wherein a height of the projection is no more than about 85.7% of the thickness of the piezoelectric thin film.

* * * * *